United States Patent [19]
Semenik et al.

[11] Patent Number: 6,133,657
[45] Date of Patent: Oct. 17, 2000

[54] VIBRATOR BRACKET

[75] Inventors: Scott Semenik, Lake Zurich; Frank Annerino, Lombard; Martin J. Kimball, Round Lake Beach, all of Ill.

[73] Assignee: Motorola, Inc., Schaumburg, Ill.

[21] Appl. No.: 08/309,280

[22] Filed: Sep. 20, 1994

[51] Int. Cl.[7] ............................................. H02K 7/00
[52] U.S. Cl. ............................................. 310/81
[58] Field of Search ................................. 310/81

[56] References Cited

U.S. PATENT DOCUMENTS

| | | | |
|---|---|---|---|
| 3,657,759 | 4/1972 | Sawyer | 15/98 |
| 4,365,179 | 12/1982 | Magdaleno | 310/81 |
| 4,794,392 | 12/1988 | Selinko | 310/81 |
| 4,864,276 | 9/1989 | Tribbey et al. | 340/407 |
| 5,107,155 | 4/1992 | Yamaguchi | 310/81 |
| 5,373,207 | 12/1994 | Yamaguchi et al. | 310/81 |
| 5,437,608 | 8/1995 | Cutler | 601/49 |

FOREIGN PATENT DOCUMENTS

| | | | |
|---|---|---|---|
| 0827344 | 4/1938 | France | 310/81 |
| 2706053 | 8/1978 | Germany | 310/81 |
| 4275046 | 9/1992 | Japan | 310/81 |

*Primary Examiner*—Thomas M. Dougherty
*Attorney, Agent, or Firm*—Randall S. Vaas; Michael C. Soldner

[57] ABSTRACT

A vibrator bracket 224 for mounting a vibrator 226 including a motor 228, a shaft 231 controlled by the motor and weight 232. The bracket has members (260, 261) to engage the motor. The bracket has a shaft support, including an opening 275 for receipt of an end of the shaft remote form the motor whereby the shaft is positioned in the opening and deflection of the shaft is limited by the support.

13 Claims, 3 Drawing Sheets

VIBRATOR BRACKET

FIELD OF THE INVENTION

The present invention relates to vibrators, and more particularly to brackets for mounting vibrators.

BACKGROUND OF THE INVENTION

Vibrators including a motor and weight (sometimes referred to as a weight) are used in a variety of products. For example, pagers and radio telephones employ vibrators to effect a silent page or incoming call alerting signal. If the device is positioned against the user's body, such as by placement in a shirt pocket or hung from a belt, the vibration alerts the user without others hearing the device. This silent alert is particularly advantageous in meetings or in offices where a lot of people share common space.

Vibrators generally include a motor, a shaft driven by the motor, and a counterweight supported on the shaft. To provide a significant vibration, the shaft radius must be small and the counterweight must be significantly larger. Because of the significant difference between the weight's radius and the shaft's radius, the weight can cause a substantial deflection of the shaft if the device experiences a severe force, such as that experienced when the device is dropped. This severe deflection can result in a permanent deformation of the shaft, which deformation can cause the vibrator weight to hit the device housing, such that, an audible alert is produced. This noise is contrary to the purpose of the vibrator, and therefor undesirable.

Accordingly it is desirable to provide a vibrator that can withstand severe forces experienced by the devices which employ them.

DETAILED DESCRIPTION

A vibrator bracket includes members to engage a vibrator motor. The bracket also includes mounting feet for positioning the bracket on a support surface. The bracket further includes a shaft deflection stop to limit the movement of the shaft of a vibrator. The shaft deflection stop prevents severe deformation of the shaft to prevent permanent damage thereof.

Figure 1:
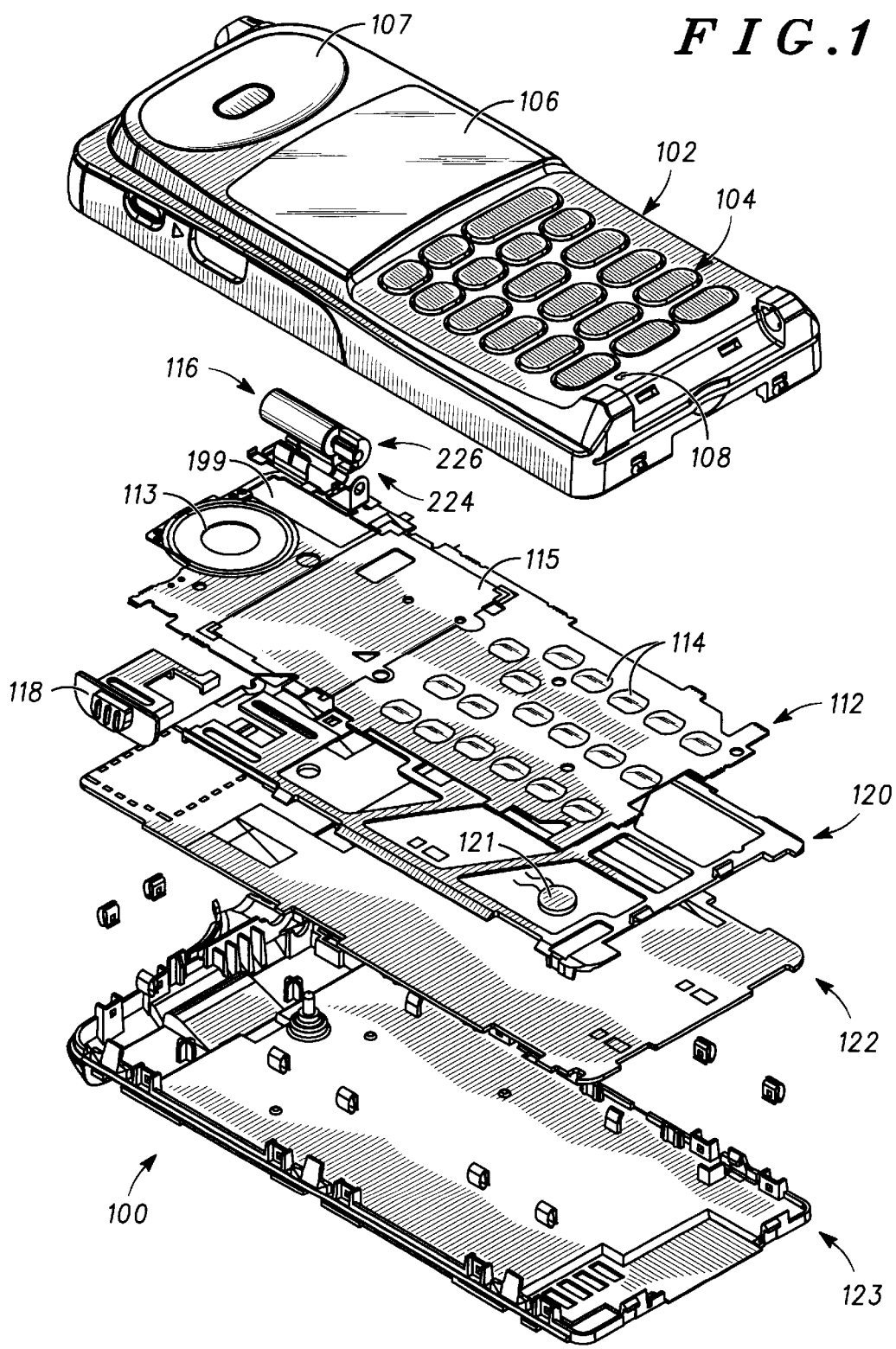
FIG. 1 is a top exploded perspective view illustrating a radio telephone.

A radio telephone 100 is illustrated in FIG. 1. The radio telephone includes a front housing 102. The front housing includes a key pad 104, a display lens 106, a speaker opening 107, and a microphone opening 108. The radio telephone further includes a logic printed circuit board 112 which supports circuitry for the radio telephone, including popple switches 114 (only some of which are numbered) actuated by keypad 104, a display source 115, and a speaker 113. A vibrator assembly 116 is also supported on the logic circuit board 112. The radio telephone 100 also includes an ejector 118, for ejecting memory cards, support web 120, and a microphone 121. An RF circuit board 122 is also supported between the housing section 102 and a back housing section 123. Back housing section 123 is assembled to the front housing section 102 to enclose the radio telephone's components.

Although the preferred embodiment is illustrated in a radio telephone, it will be recognized that the vibrator assembly may be advantageously employed in other devices such as pagers, personnel communication devices, or the like. Accordingly, "device" as used herein will refer to all such equipment and their equivalents.

The vibrator assembly 116 (FIG. 2) includes a bracket 224 and a vibrator 226. Vibrator 226 may be any commercially available vibrator. The vibrator includes a cylindrical motor 228 having wires 229 and 230 for connection to a control power source (not shown) on logic circuit board 112. A shaft 231 extends from motor 228. A weight 232 is positioned nonconcentrically on shaft 231 such that it rotates when a DC potential is applied to the motor by circuitry on the logic board 112 via conductors 229 and 230. The nonconcetric positioning of the weight causes the shaft to vibrate. The weight is significantly larger than the shaft, which causes a vibration. However, it also places a significant load on the shaft.

Figures 3, 6:
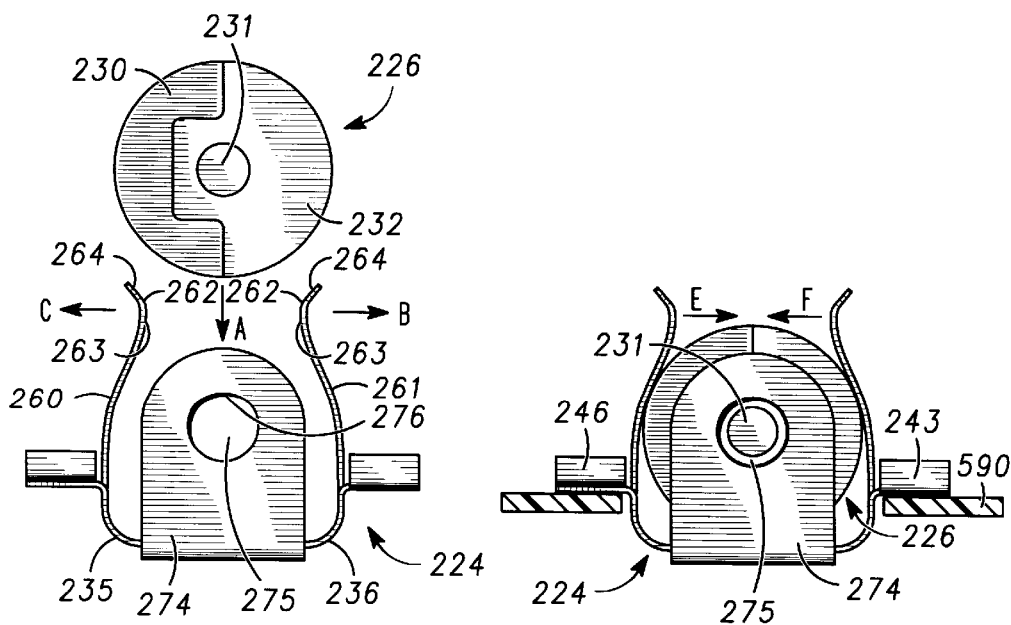
FIG. 3 is an exploded end elevational view illustrating the vibrator and bracket.
FIG. 6 is an end cross-sectional view of the vibrator and circuit board taken along plane VI—VI in FIG. 6.

Bracket 224 includes a generally rectangular plate 234. Arms 235 and 236 extend outwardly from plate 234. A hand 237 extends from arm 235 and a hand 239 extends from arm 236 in the illustrated embodiment. Each arm is bowed such that it has a curved profile as best seen in FIG. 3. The bracket also includes a leg 240 and a leg 241.

Figure 5:
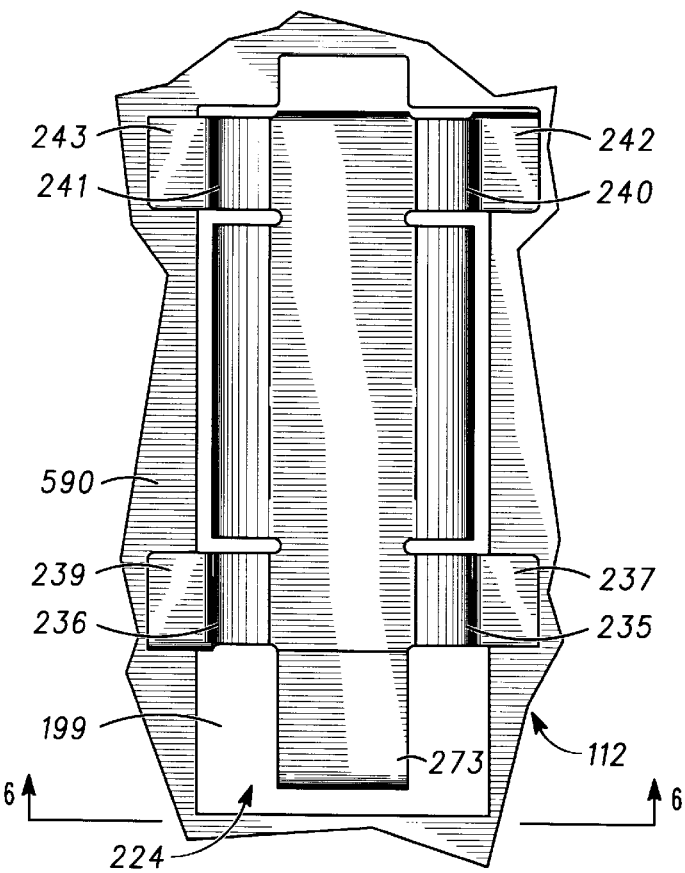
FIG. 5 is a fragmentary bottom plan view illustrating a circuit board having a vibrator assembly according to FIG. 3 assembled thereto.

The legs are terminated in feet 242 and 243 for engaging a surface 590 (FIG. 5) of circuit board 112 on which bracket 224 is mounted. A front positioning tab 245 (FIG. 2) extends orthogonal upwardly from hand 239. A rear positioning tab 246 extends orthogonally upwardly from a foot 242. The front and rear positioning tabs 245 and 246 locate bracket 224 on logic circuit board 112. A vibrator motor engagement member 250 and a rear vibrator positioning member 251 extend orthogonally upwardly from opposite ends of the plate 234. The front and rear vibrator positioning members are used to secure the longitudinal position of the vibrator motor on the plate 234 and hold it securely thereon. A suitable commercially available adhesive or fastener may be used to attach bracket 224 to circuit board 112.

Bracket 224 also includes motor engagement members 260 and 261. The motor engagement members each include curved fingers 262. As best seen in FIG. 3, the fingers curve inwardly toward one another. The end 264 of the each finger extend outwardly from the apex thereof.

The bracket 224 (FIG. 2) includes a shaft support 269 that provides drop protection. The support 269 is integral with plate 234.

Shaft support 269 includes joinders 271 and 272 extending between a horizontal member 273 and plate 234. A vertically extending member 274 projects generally orthogonally to horizontal member 273. The vertically extending member includes an aperture 275 for receipt of the shaft 231 of vibrator 226. The aperture 275 preferably has a diameter that is larger than the diameter of shaft 231, such that the shaft support does not interfere with the movement of shaft 231 unless the shaft is severely deflected by weight 232. If deflection of the shaft is severe enough, shaft 231 contacts edge 276 of aperture 275. The diameter of the aperture 275 is thus larger than the shaft to allow rotational movement of the shaft without a surface of the shaft contacting another surface unless there is a severe radial deflection of the shaft. Radial deflection of the shaft caused by a force transverse to the shaft is limited to the distance across the gap between the outer surface of the shaft and the edge 276 of aperture 275.

Figure 2:
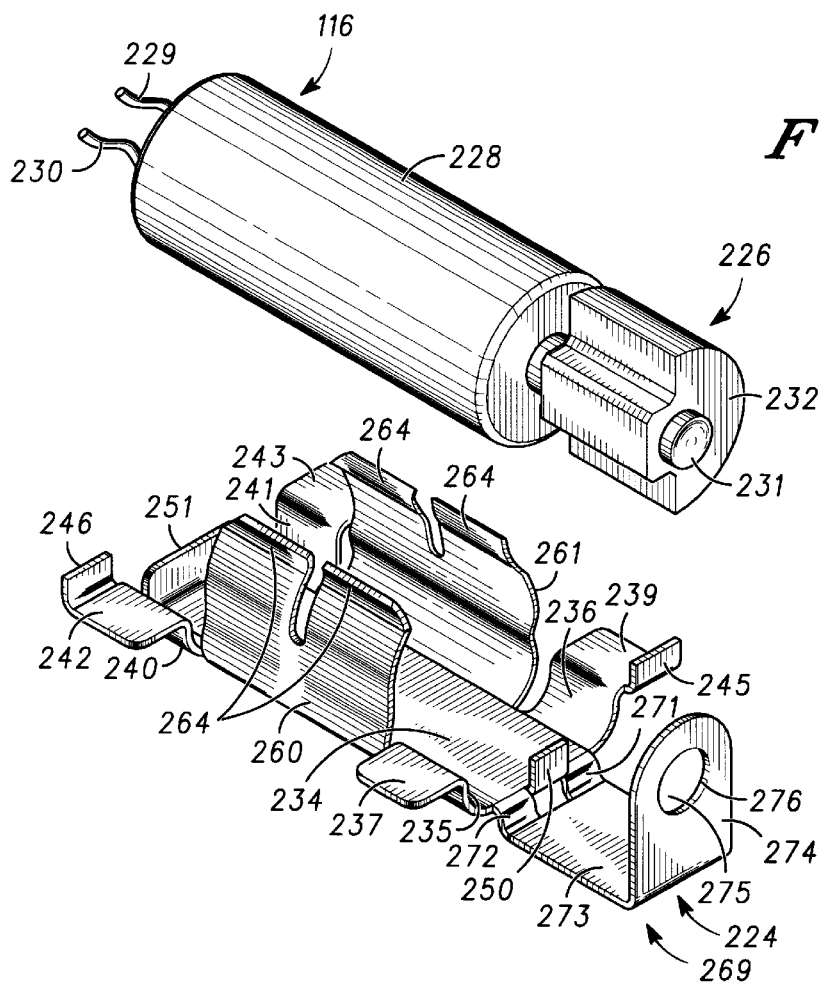
FIG. 2 is an exploded perspective view illustrating a printed circuit board, bracket, and vibrator in the telephone according to FIG. 1.

Bracket 224 may be constructed any suitable conventional means such as a one piece member which is stamped from a metal material and is bent to the configuration illustrated in FIG. 2. The material is preferably sufficiently resilient that members 260 and 261 spread outwardly in directions B and C when the motor is pressed downwardly in direction A during assembly and return to their original position to hold the vibrator motor securely in position. The material is also significantly strong to limit the deflection of the weight 232 when a severe force is exerted on the housing.

Figure 4:
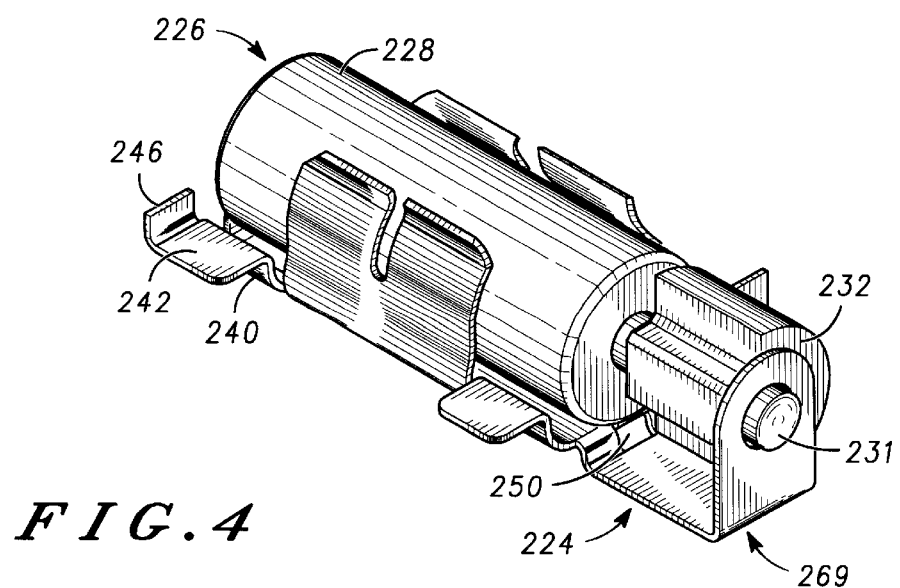
FIG. 4 is a perspective view illustrating a vibrator assembly including the vibrator and bracket according to FIG. 2.

To assemble the vibrator assembly, motor 228 is pressed downwardly in direction A (FIG. 3). Motor 228 contacts ends 264 of members 260 and 261. These members are pressed outwardly in direction B and C by the motor. The end of shaft 231 is then moved into opening 275, while the motor is moved into abutting relationship with plate 234, between member 250 and member 251. The fully assembled position is illustrated in FIGS. 4 and 6. In this position, shaft 231 is inside aperture 275, and doesn't contact edge 276. This allows the shaft to spin and vibrate without contacting edge 276.

The vibrator assembly 116 is assembled to logic board 112 at opening 199. Hand 237, hand 239, foot 242, and foot 234, are attached to the bottom surface 590 (FIG. 5) of logic circuit board 112. Members 245 and 246 abut with edges of the printed circuit board longitudinally position the vibrator assembly.

In operation, if radio telephone 100 is dropped in a direction transverse to the shaft 231 longitudinal axis, the shaft 231 will deflect. If the force is sufficiently strong, the shaft 231 will deflect until it contacts edge 276. However, the shaft won't bend further than this edge. This limit of shaft deflection prevents the shaft from deflecting so much that the weight contacts the interior surface of the front housing against which the printed circuit board is held. The vibrator is assembled in the device near the housing such that the vibrations are communicated through the device to a user. This prevents the vibrator from making a thumping sound when it runs. Additionally, by limiting the shaft deflection, permanent harmful deformation is prevented.

Accordingly, it can be seen that a vibrator bracket is disclosed that prevents damaging deflection of a vibrator shaft. This insures that the vibrator will remain operable, and silent, even if the device in which it is mounted is dropped. The apparatus thus provides longer lasting silent operation relative to prior arbitrators.

What is claimed is:

1. A vibrator bracket for mounting a vibrator including a motor and weight carried on a shaft, the shaft having a diameter and being driven by the motor, the bracket comprising:
   a plate;
   first and second members extending from the plate to hold the motor;
   and a shaft support extending from the plate and including an opening larger than the diameter of the shaft for receiving an end of the shaft remote from the motor to allow radial movement of the shaft within the opening and to limit radial deflection of the shaft to a distance across a gap between an outer surface of the shaft and an edge of the opening.

2. The vibrator bracket as defined in claim 1, wherein the opening has a diameter which is larger than the diameter of the shaft.

3. The vibrator bracket as defined in claim 2, wherein the shaft support includes a third member extending from the plate generally parallel to the shaft.

4. The vibrator bracket as defined in claim 3, further including a fourth member extending orthogonal from the third member, the forth member including the opening.

5. In combination:
   a vibrator including a motor, a shaft driven by the motor and a weight carried on the shaft; and
   a bracket including
   a plate,
   at least one member extending from the plate to hold the motor,
   and a shaft support extending from the plate and including an opening for receiving an end of the shaft remote from the motor, a diameter of the shaft being smaller than the opening to provide a gap between the shaft and the shaft support, wherein the shaft is positioned in the opening to permit rotation and some flexing of the shaft without a surface of the shaft contacting another surface and to limit deflection of the shaft to the gap within the opening to protect against severe deflection of the shaft.

6. The combination as defined in claim 5, wherein the opening has a diameter which is larger than a diameter of the shaft.

7. The combination as defined in claim 6, wherein the shaft support includes a third member extending from the plate generally parallel to the shaft.

8. The combination as defined in claim 6, wherein the opening is in a fourth member extending orthogonally from the third member.

9. A radio telephone comprising:
   a circuit board supporting electrical components of the radio telephone;
   a vibrator including a motor, a counter weight, and a shaft coupled to the motor and carrying the counter weight thereon; and
   a bracket including
   at least one member extending from the plate to engage the motor,
   and a shaft support extending from the plate and including an opening, an end of the shaft remote from the motor positioned in the opening and spaced from the support to permit rotation of the shaft without contacting the support and allowing some radial deflection of the shaft, the shaft not contacting an edge of the support unless the radiotelephone experiences a severe force transverse to a longitudinal axis of the shaft whereby the support limits radial deflection of the shaft.

10. The radio telephone as defined in claim 9, wherein the opening has a diameter which is larger than a diameter of the shaft.

11. The radio telephone as defined in claim 10, wherein the shaft support includes a third member extending from the plate generally parallel to the shaft.

12. The radio telephone as defined in claim 11, further including a fourth member extending orthogonally from the third member, the opening in the fourth member.

13. The radio telephone as defined in claim 12, wherein the bracket includes support elements extending from the plate for mounting the bracket on the printed circuit board.

* * * * *